United States Patent
Huang et al.

(10) Patent No.: US 8,772,780 B2
(45) Date of Patent: Jul. 8, 2014

(54) ARRAY SUBSTRATE STRUCTURE OF DISPLAY PANEL AND METHOD OF MAKING THE SAME

(75) Inventors: Kuo-Yu Huang, Hsin-Chu (TW); Te-Chun Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/609,272

(22) Filed: Sep. 11, 2012

(65) Prior Publication Data

US 2013/0168707 A1    Jul. 4, 2013

(30) Foreign Application Priority Data

Dec. 30, 2011 (TW) .............................. 100149969 A (51) Int. Cl.
*H01L 29/04* (2006.01)

(52) U.S. Cl.
USPC ............... 257/59; 257/E33.053; 257/E21.409

(58) Field of Classification Search
CPC .. H01L 21/77; H01L 27/3276; H01L 27/1225
USPC .............................. 257/88, E21.409, E33.053
See application file for complete search history.

(56) References Cited

U.S. PATENT DOCUMENTS

| 7,687,289 | B2* | 3/2010 | Lin et al. | 438/30 |
| 7,839,462 | B2 | 11/2010 | Lin | |
| 2005/0007322 | A1* | 1/2005 | Adachi et al. | 345/82 |
| 2010/0065842 | A1 | 3/2010 | Yamazaki et al. | |
| 2010/0149465 | A1 | 6/2010 | Lin | |
| 2010/0187537 | A1 | 7/2010 | Lin | |
| 2011/0227085 | A1* | 9/2011 | Nakamura et al. | 257/59 |

FOREIGN PATENT DOCUMENTS

| CN | 101441348 A | 5/2009 |
| TW | 201017887 | 5/2010 |

\* cited by examiner

*Primary Examiner* — Yu-Hsi D Sun
*Assistant Examiner* — Christina Sylvia
(74) *Attorney, Agent, or Firm* — Winston Hsu; Scott Margo (57) ABSTRACT

An array substrate structure of a display panel includes a substrate, a plurality of first wirings, a first patterned insulating layer, a plurality of second wirings, a plurality of first protective patterns, and a plurality of second protective patterns. The substrate has a wiring region. The first wirings are disposed in the wiring region. The first patterned insulating layer is disposed on the first wirings. The second wirings are disposed on the first patterned insulating layer. The first protective patterns are disposed in the wiring region and disposed on the corresponding second wiring, respectively, where the first protective pattern includes a semiconductor material. The second protective patterns are disposed on the corresponding first protective pattern, respectively, where the second protective pattern includes an inorganic insulating material.

23 Claims, 10 Drawing Sheets

ARRAY SUBSTRATE STRUCTURE OF DISPLAY PANEL AND METHOD OF MAKING THE SAME

BACKGROUND OF THE INVENTION

1. Field of the Invention

The present invention relates to an array substrate structure of a display panel and method of making the same, and more particularly, to an array structure of a display panel and the method of making the same that is able to prevent wirings in the wiring region from being damaged during fabricating process.

2. Description of the Prior Art

A substrate of an array substrate structure of a display panel is typically defined to a display region, a wiring region, and a pad region. Gate lines, data lines, pixel arrays, and thin film transistors (TFTs) are disposed in the display region. Wirings for electrically connecting the gate lines and the data lines to the pad region are disposed in the wiring region. And the pad region provides electrical connection between the gate lines/ the data lines and a driving chip or a circuit board. Accordingly, driving signals from the driving chip or the circuit board are provided to the gate lines and the data lines through the wirings.

Conventionally, etching processes for defining conductive layers, semiconductor layers, dielectric layers, and protecting layers are required for fabricating the array substrate structure of the display panel. However, it is found that the pre-layer exposed by the specific material layer being etched is unavoidably damaged. For example, the wirings under the protecting layer are often damaged during etching the protecting layer. Consequently, yield of the array substrate structure of the display panel is adversely impacted and thus cannot be improved.

SUMMARY OF THE INVENTION

It is therefore one of the objectives of the present invention to provide an array substrate structure of a display panel and method of making the same to improve yield and reliability of the array substrate structure of the display panel.

According to a preferred embodiment, a method for forming an array substrate structure of a display panel is provided. A substrate having a display region and a wiring region defined thereon is provided. A first patterned conductive layer is formed on the substrate, wherein the first patterned conductive layer includes a plurality of gate lines, a plurality of gate electrodes, and a plurality of first gate tracking lines. The gate lines are disposed in the display region, the gate electrodes are disposed in the display region, and the first gate tracking lines are disposed in the wiring region. The first gate tracking lines are electrically connected to a portion of the gate lines. A first patterned insulating layer is formed on the first patterned conductive layer, wherein the first patterned insulating layer has a plurality of first contact holes respectively exposing a portion of the gate lines. A second patterned conductive layer is formed on the first patterned insulating layer, and the second patterned conductive layer comprises a plurality of data lines, a plurality of source electrodes, a plurality of drain electrodes, and a plurality of second gate tracking lines. The data lines are disposed in the display region, the source electrodes and the drain electrodes are disposed in the display region, and the second gate tracking lines are electrically connected to the exposed gate lines through the first contact holes. A patterned semiconductor layer and a second patterned insulating layer are formed on the second patterned conductive layer. The patterned semiconductor layer includes a plurality of semiconductor channel layers and a plurality of first protective patterns, wherein the semiconductor channel layers are disposed in the display region and respectively disposed on the corresponding gate electrodes, and at least a portion of the first protective patterns are disposed in the wiring region and disposed on the corresponding second gate tracking lines. The second patterned insulating layer includes a plurality of channel protective layers and a plurality of second protective patterns, wherein the channel protective layers are disposed in the display region and disposed on the corresponding semiconductor channel layers, and at least a portion of the second protective patterns are disposed in the wiring region and respectively disposed on the corresponding the first protective patterns. A first patterned protective layer and a second patterned protective layer are formed on the second patterned conductive layer, wherein the first patterned protective layer and the second patterned protective layer expose each of the second protective patterns, and the first patterned protective layer and the second patterned protective layer have a plurality of second contact holes respectively exposing the drain electrodes. A first patterned transparent conductive layer is formed on the second patterned protective layer.

According to another preferred embodiment of the present invention, an array substrate structure of a display panel is provided. The array substrate structure of the display panel includes a substrate, a plurality of first wirings, a first patterned insulating layer, a plurality of second wirings, a plurality of first protective patterns, and a plurality of second protective patterns. The substrate includes a wiring region. The first wirings are disposed in the wiring region, the first patterned insulating layer is disposed on the first wirings, and the second wirings are disposed on the first patterned insulating layer. The first protective patterns are disposed in the wiring region and respectively disposed on the corresponding second wirings, wherein each of the first protective patterns includes a semiconductor material. The second protective patterns are disposed in the wiring region and respectively disposed on the corresponding first protective patterns, wherein each of the second protective patterns includes an inorganic insulating material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-2 are schematic diagrams illustrating an array substrate structure of a display panel according to a preferred embodiment of the present invention; wherein

DETAILED DESCRIPTION

To provide a better understanding of the present invention, preferred embodiments will be made in detail. The preferred embodiments of the present invention are illustrated in the accompanying drawings with numbered elements.

Figure 1:
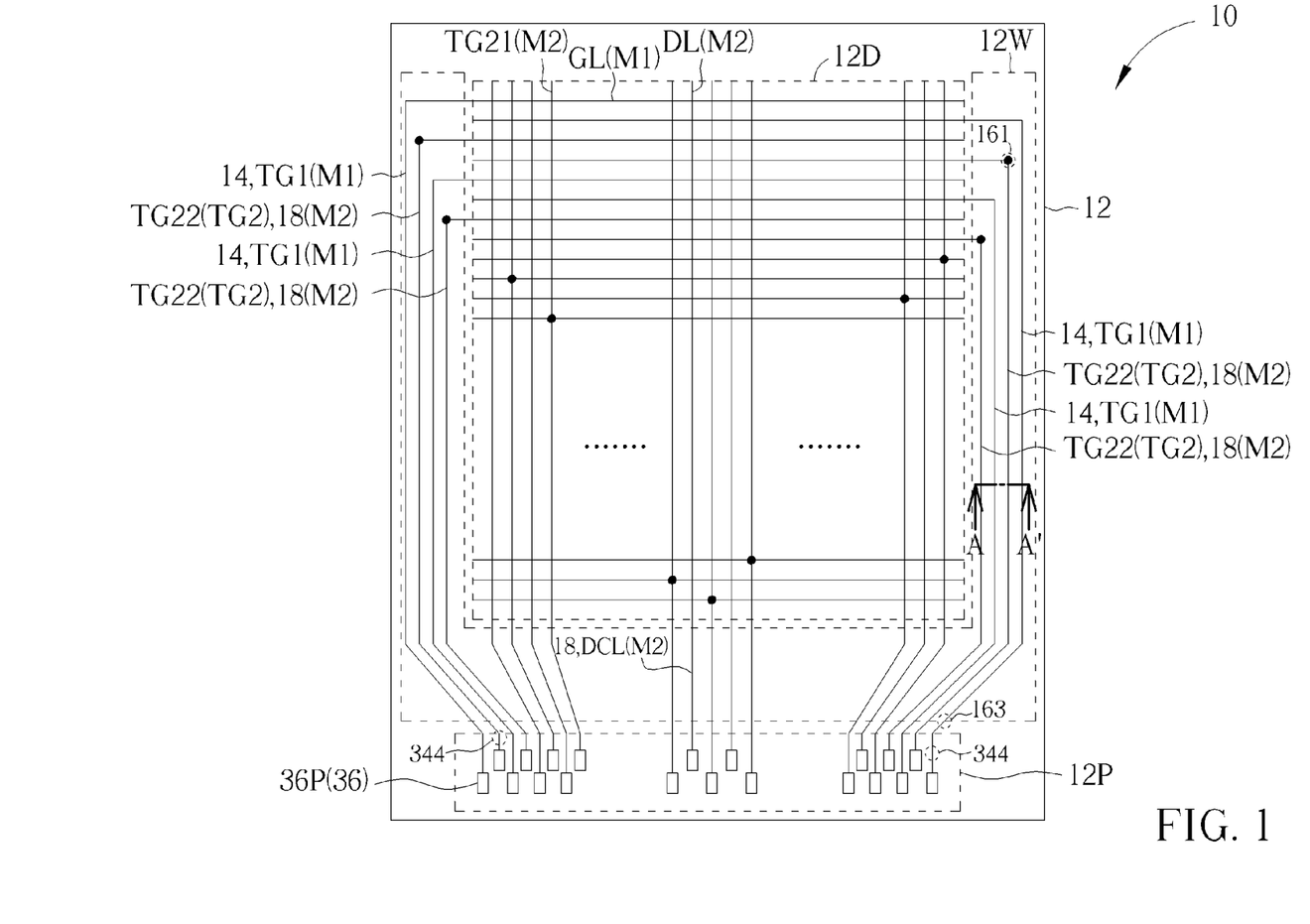
FIG. 1 is a top view of the array substrate structure of the display panel according to the preferred embodiment.
Figure 2:
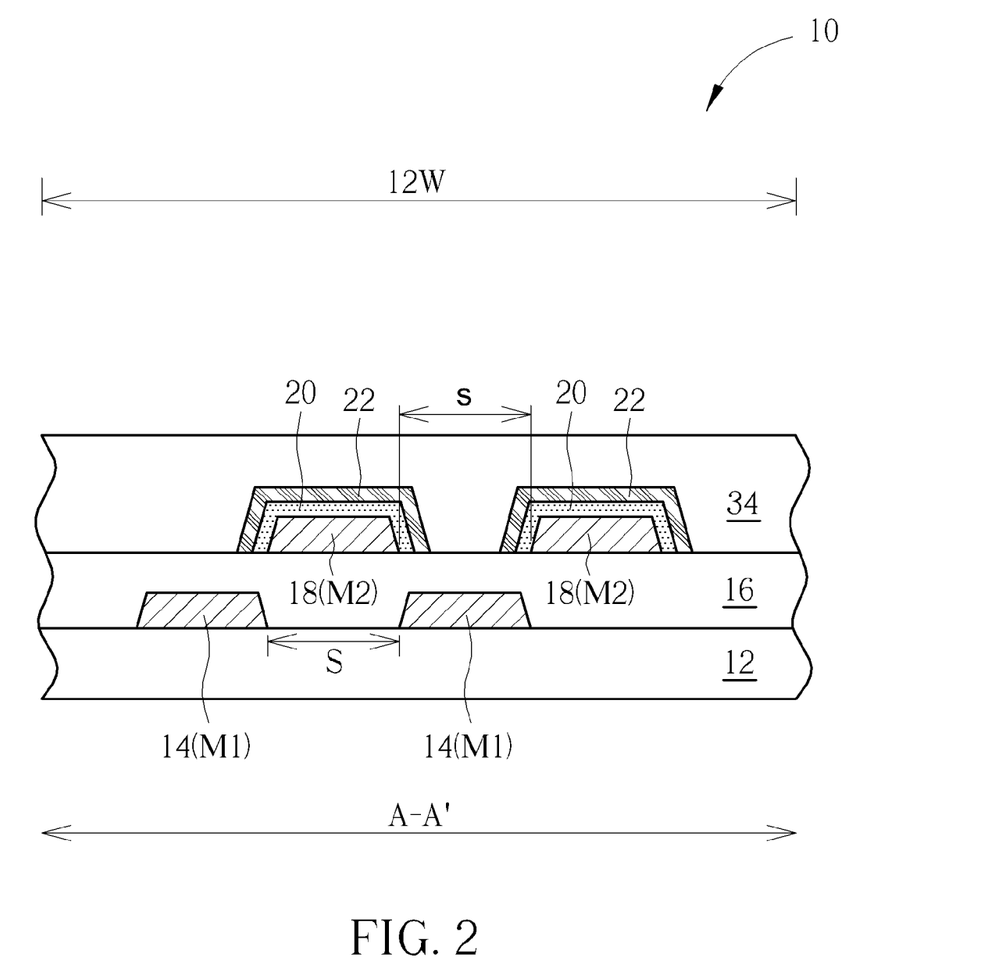
FIG. 2 is a cross-sectional view taken along line A-A' of FIG. 1.

Please refer to FIGS. 1-2, FIGS. 1-2 are schematic diagrams illustrating an array substrate structure of a display panel according to a preferred embodiment of the present invention, wherein FIG. 1 is a top view of the array substrate structure of the display panel according to the preferred embodiment and FIG. 2 is a cross-sectional view taken along line A-A' of FIG. 1. It should be noted that the preferred embodiment exemplarily provides an array substrate structure of a fringe field switching (FFS) liquid crystal display panel, but not limited to this. For example, the array substrate structure of the display panel can be an array substrate structure of any types of LCD panel, electroluminescent display panel and any types of display panel. As shown in FIG. 1 and FIG. 2, the array substrate structure 10 of the preferred embodiment includes a substrate 12, a plurality of first wirings 14, a first patterned insulating layer 16 (not shown in FIG. 1), a plurality of second wirings 18, a plurality of first protective patterns 20 (not shown in FIG. 1), and a plurality of the second protective patterns 22 (not shown in FIG. 1). The substrate 12 includes a display region 12D (not shown in FIG. 2), a wiring region 12W and a pad region 12P (not shown in FIG. 2). The first wirings 14 are disposed in the wiring region 12W, the first patterned insulating layer 16 are disposed on the first wirings 14, and the second wirings 18 are disposed on the first patterned insulating layer 16. At least a portion of the first protective patterns 20 are disposed in the wiring region 12W and respectively disposed on the corresponding second wirings 18. Each of the first protective patterns 20 includes a semiconductor material, such as an oxide semiconductor material (for example but not limited to, Indium-Gallium-Zinc-Oxide, IGZO). At least a portion of the second protective patterns 22 are disposed in the wiring region 12W and respectively disposed on the corresponding first protective patterns 20. Each of the second protective patterns 22 includes an inorganic insulating material such as silicon oxide. The first protective patterns 20 and the second protective patterns 22 cover the second wirings 18, and may further cover sidewalls of the second wirings 18, but not limited to this. The adjacent first protective patterns 20 or the adjacent second protective patterns 22 include a gap "s" therebetween.

As shown in FIG. 1, the array substrate structure 10 of the preferred embodiment further includes a plurality of gate lines GL and a plurality of data lines DL. The gate lines GL and the data lines DL are intersected with each other and disposed in the display region 12D. The first wirings 14 and the gate lines GL are formed by the first patterned conductive layer, and the first wirings 14 are electrically connected to a portion of the gate lines GL to serve as first gate tracking lines. The second wirings 18 and the data lines DL are formed by the second patterned conductive layer, and the second wirings 18 are electrically connected to another portion of the gate lines GL to serve as second gate tracking lines. A shown in FIG. 2, since the adjacent first wirings 14 and second wirings 18 are alternately arranged and formed by different patterned conductive layers, horizontal distance between the first wirings 14 and the second wirings 18 is no longer limited by the fabricating process, and thus area of the wiring region 12W is reduced.

Figure 3:
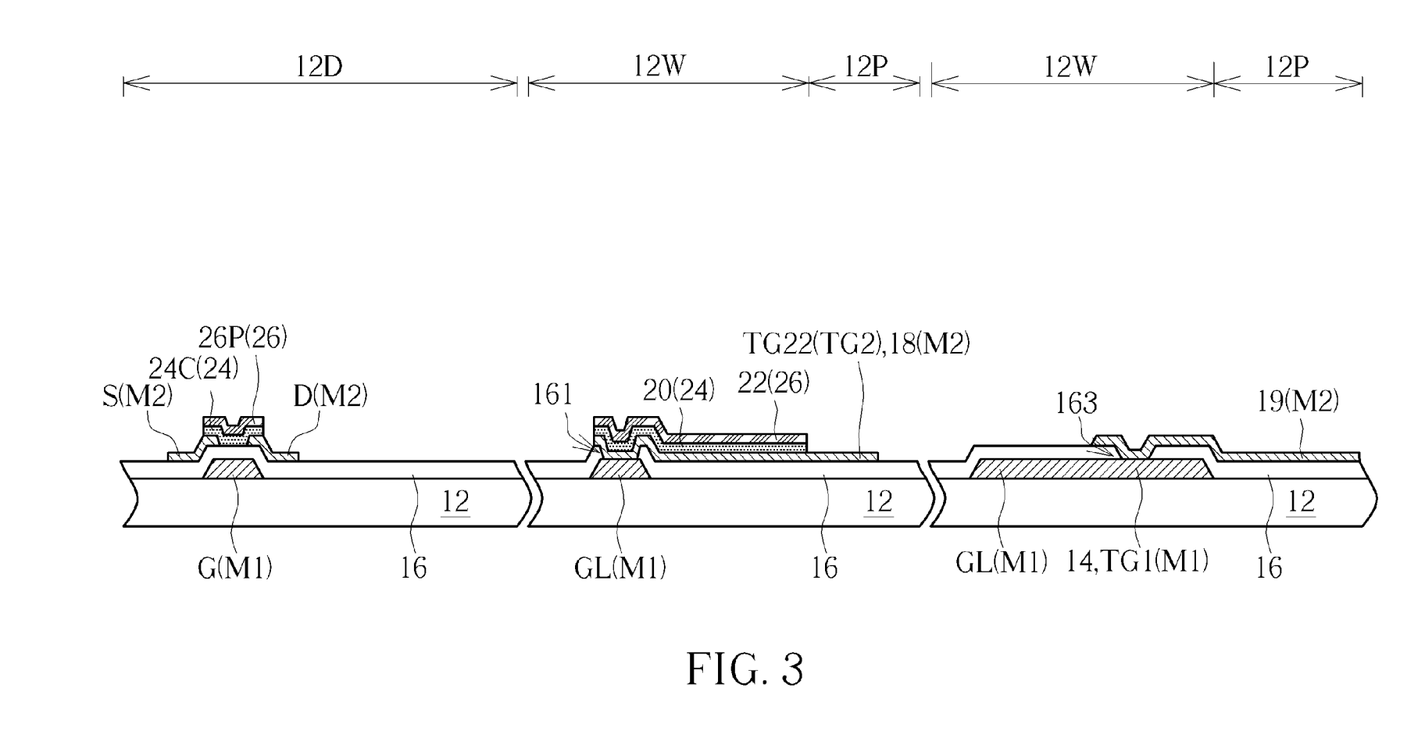
FIGS. 3-5 are schematic diagrams illustrating a method for forming an array substrate structure of a display panel according to the preferred embodiment of the present invention.
Figure 4:
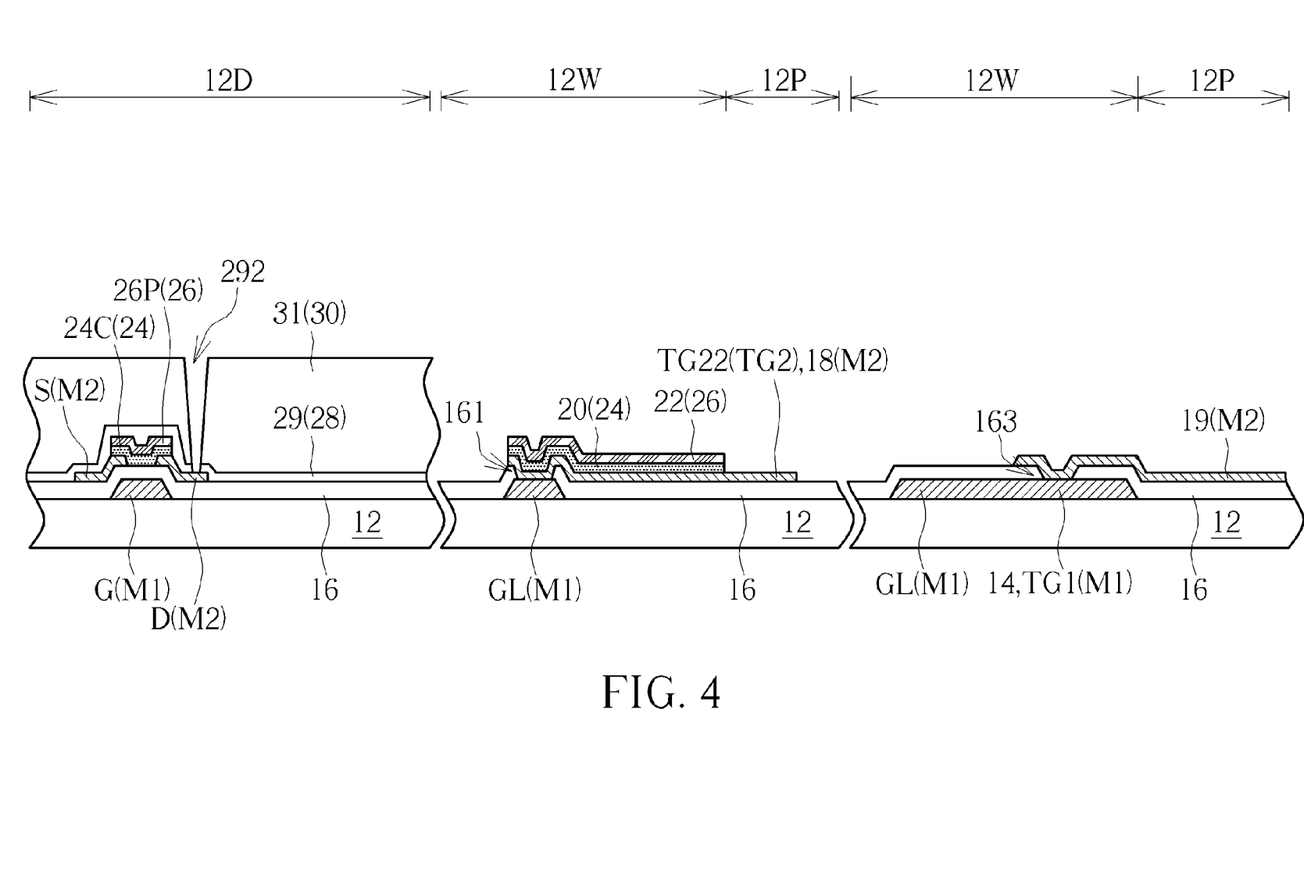
Figure 5:
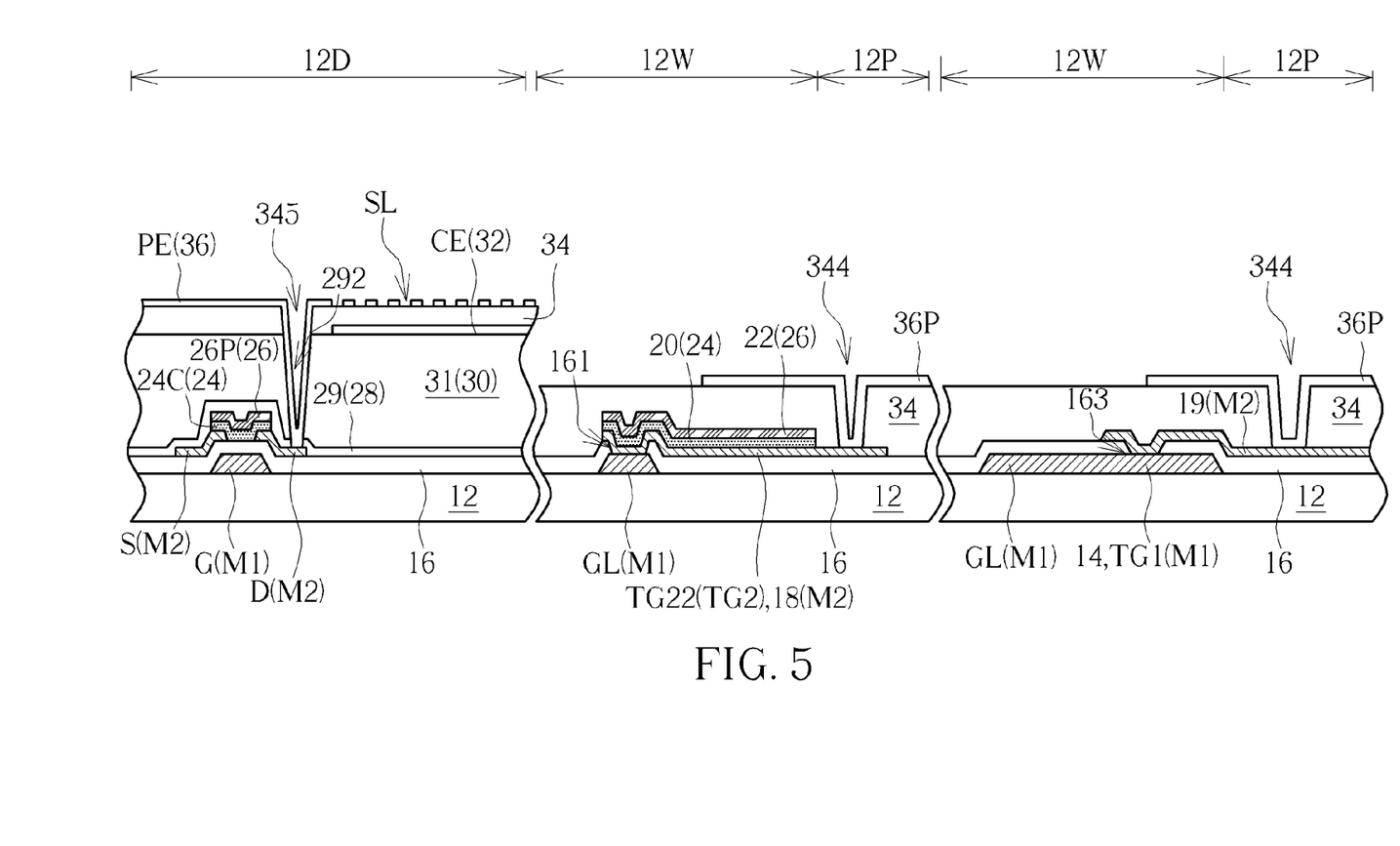

Please refer to FIGS. 3-5. In order to clearly describe the structure of the present invention, FIGS. 1 and 2 also should be referred together. FIGS. 3-5 are schematic diagrams illustrating a method for forming an array substrate structure of a display panel according to the preferred embodiment of the present invention. As shown in FIG. 1 and FIG. 3, the substrate 12 is firstly provided. Then, a first patterned conductive layer M1 is formed on the substrate 12. The first patterned conductive layer M1 includes a plurality of the gate lines GL disposed in the display region 12D, a plurality of gate electrodes G disposed in the display region 12D, and a plurality of first gate tracking lines TG1 (the first wirings 14) disposed in the wiring region 12W. The first gate tracking lines TG1 (the first wirings 14) are electrically connected to a portion of the gate lines GL for transferring scan signals to the gate lines GL. Subsequently, a first patterned insulating layer 16 is formed on the first patterned conductive layer M1. The first patterned insulating layer 16 has a plurality of first contact holes 161 respectively exposing a portion of the gate lines GL and a plurality of third contact holes 163 respectively exposing the first gate tracking lines TG1 (the first wirings 14). Next, a second patterned conductive layer M2 is formed on the first patterned insulating layer 16. The second patterned conductive layer M2 includes a plurality of data lines DL disposed in the display region 12D, a plurality of source electrodes S and a plurality of drain electrodes D disposed in the display region 12D, a plurality of second gate tracking lines TG2 (the second wirings 18), and a plurality of connecting electrodes 19 disposed in the wiring region 12W. The second gate tracking lines TG2 (the second wirings 18) are electrically connected to the exposed gate lines GL through the first contact holes 161 for transferring signals to the gate lines GL. The connecting electrodes 19 are electrically connected to the first gate tracking lines TG 1 through the third contact holes 163. It is noteworthy that as shown in FIG. 1, according to the preferred embodiment, the second wirings 18 further includes a plurality of data connecting lines DCL disposed in the wiring region 12W and electrically connected to the corresponding data lines DL in the display region 12D for transferring data signals to the data lines DL, respectively. The second gate tracking lines TG2 includes a plurality of second internal gate tracking lines TG21 disposed in the display region 12D and extending to the wiring region 12W, and a plurality of second external gate tracking lines TG22 disposed in the wiring region 12W. Subsequently, a patterned semiconductor layer 24 and a second patterned insulating layer 26 are formed on the second patterned conductive layer M2. The patterned semiconductor layer 24 includes a plurality of semiconductor channel layers 24C disposed in the display region 12D and respectively disposed on the corresponding gate electrodes G, and a plurality of first protective patterns 20 disposed in the wiring region 12W and respectively disposed on the corresponding second gate tracking lines TG2 (the second wirings 18). The second patterned insulating layer 26 includes a plurality of channel protective layers 26P disposed in the display region 12D and respectively disposed on the corresponding semiconductor channel layers 24C, and a plurality of second protective patterns 22 disposed in the wiring region 12W and respectively disposed on the corresponding first protective patterns 20.

As shown in FIG. 1 and FIG. 4, a first protective layer 28 and a second protective layer 30 are then formed on the second patterned conductive layer M2. The first protective layer 28 includes an inorganic protective layer such as a silicon nitride layer, and the second protective layer 30 includes an organic protective layer such as photosensitive resin, but not limited to this. Then, a photolithography process is performed on the second protective layer 30. Consequently, portions of the second protective layer 30 are removed to form a second patterned protective layer 31. Subsequently, an etching process is performed with the second patterned protective layer 31 serving as an etching mask. Thus the first protective layer 28 exposed by the second patterned protective layer 31 is etched to form a first patterned protective layer 29. The first patterned protective layer 29 and the second patterned protective layer 31 have a plurality of second contact holes 292 respectively exposing the drain electrodes D. In the preferred embodiment, the first protective layer 28 and the second protective layer 30 are completely removed from the wiring region 12W, and thus each of the second protective patterns 22 in the wiring region 12W are entirely exposed. On the other hands, since the second wirings 18 are protected by the second protective patterns 22 and the first protective patterns 20, the second wirings 18 is prevented from being damaged during etching the first protective layer 28. In other words, as shown in FIG. 2, since the second wirings 18 are protected by the second protective patterns 22 and the first protective patterns 20, the second wirings 18 is prevented from being damaged during removing the first protective layer 28 from the wiring region 12W before forming the third patterned protective layer 34. It is noteworthy that the second wirings 18 covered by the second protective patterns 22 and the first protective patterns 20 can comprise the second internal gate tracking lines TG21, the second external gate tracking lines TG22, and the data connecting lines DCL in the wiring region 12W.

As shown in FIG. 1 and FIG. 5, a first patterned transparent conductive layer 32 is then formed on the second patterned protective layer 31, a third patterned protective layer 34 is subsequently formed on the first patterned transparent conductive layer 32, and a second patterned transparent conductive layer 36 is subsequently formed on the third patterned protective layer 34. According to the preferred embodiment, the first patterned transparent conductive layer 32 includes a plurality of common electrodes CE disposed in the display region 12D. The third patterned protective layer 34 has a plurality of fourth contact holes 344 respectively exposing each of the connecting electrodes 19 and each of the second gate tracking lines TG2 (the second wirings 18), and a plurality of fifth contact holes 345 (not shown in FIG. 1) respectively exposing each of the drain electrodes D. The third patterned protective layer 34 can include an inorganic protective layer such as a silicon nitride layer, but not limited to this. The second patterned transparent conductive layer 36 includes a plurality of pixel electrodes PE disposed in the display region 12D and a plurality of pads 36P disposed in the pad region 12P. Each of the pixel electrodes PE is electrically connected to the drain electrode D through the fifth contact hole 345 and the second contact hole 292. And each of the pixel electrodes PE has a plurality of slits SL. Each of the pads 36P is electrically connected to each connecting electrode 19 and each second gate tracking line TG2 (second wiring 18) through each fourth contact hole 344, respectively.

Figure 6:
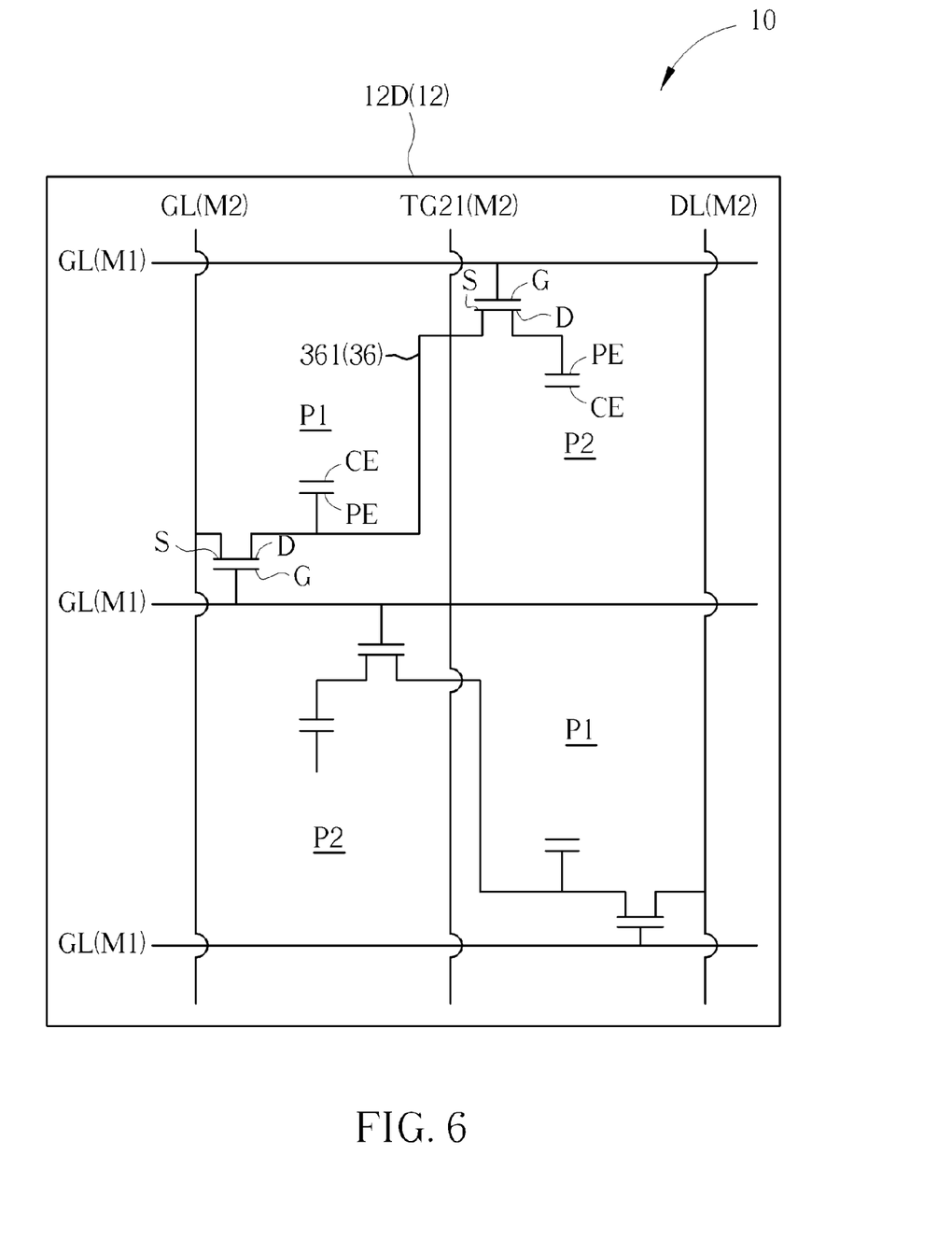
FIG. 6 is a schematic diagram illustrating a pixel of the array substrate structure of the display panel of the preferred embodiment.

Please refer to FIG. 6. In order to clearly describe the structure of the present invention, FIG. 1 and FIG. 5 also should be referred together. FIG. 6 is a schematic diagram illustrating a pixel of the array substrate structure of the display panel of the preferred embodiment. In the preferred embodiment, the display panel is a display panel adopts half source driver (HSD) approach, but not limited to this. As shown in FIG. 6, a first sub-pixel P1 and a second sub-pixel P2 are disposed in the display region 12D. The second patterned transparent conductive layer 36 further includes a transparent bridge electrode 361. The source electrode S of the first sub-pixel P1 is electrically connected to the corresponding data line DL, the pixel electrode PE of the first sub-pixel P1 is electrically connected to the drain electrode D of the first sub-pixel P1 and to the source electrode S of the second sub-pixel P2 through the transparent bridge electrode 361. And the pixel electrode PE of the second sub-pixel P2 is electrically connected to the drain electrode D of the second sub-pixel P2. According to the preferred embodiment, the adjacent first sub-pixels P1 and second sub-pixels P2 in the same row are driven by the same data line DL. Therefore, no line DL is disposed between the first sub-pixel P1 and the second sub-pixel P2. Accordingly, the second internal gate tracking lines TG21, which are used to transfer signals to the gate lines GL, are disposed in between the first sub-pixel P1 and the second sub-pixel P2. Consequently, area of the wiring region is reduced and thus display panel having narrow border is realized.

The array substrate structure of the display panel and method of making the same are not limited to above mentioned preferred embodiment. Accordingly, the present invention further provides an array substrate structure of a display panel and method of making the same according to other different preferred embodiments or modifications. To simplify the description, the identical components in each of the following are designated by the same numerals. For making it easier to compare the difference between the preferred embodiments, the following description will detail the dissimilarities among different embodiments and the identical features will not be redundantly described.

Figure 7:
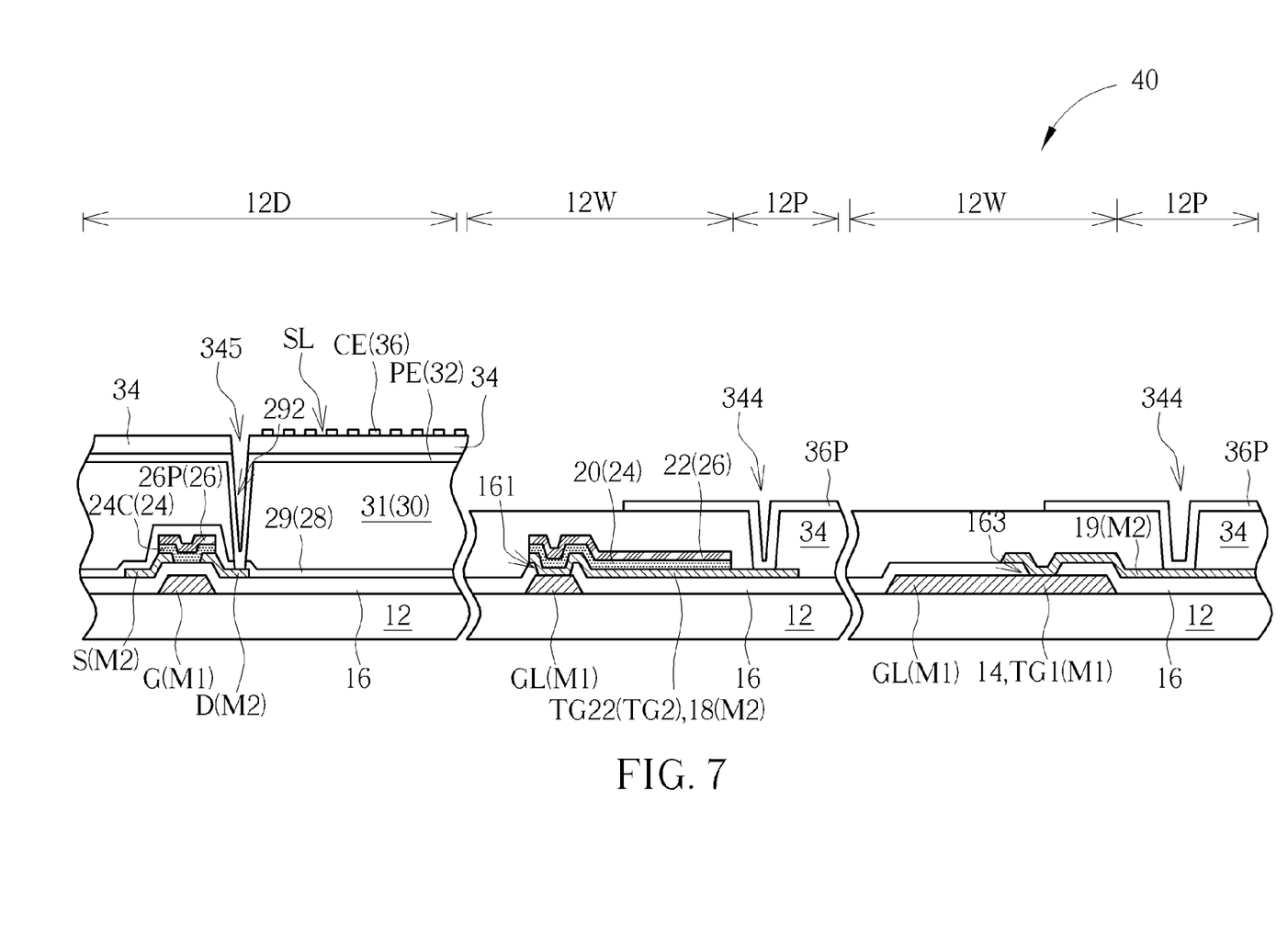
FIG. 7 is a schematic diagram illustrating an array substrate structure of a display panel according to another preferred embodiment of the present invention.
Figure 8:
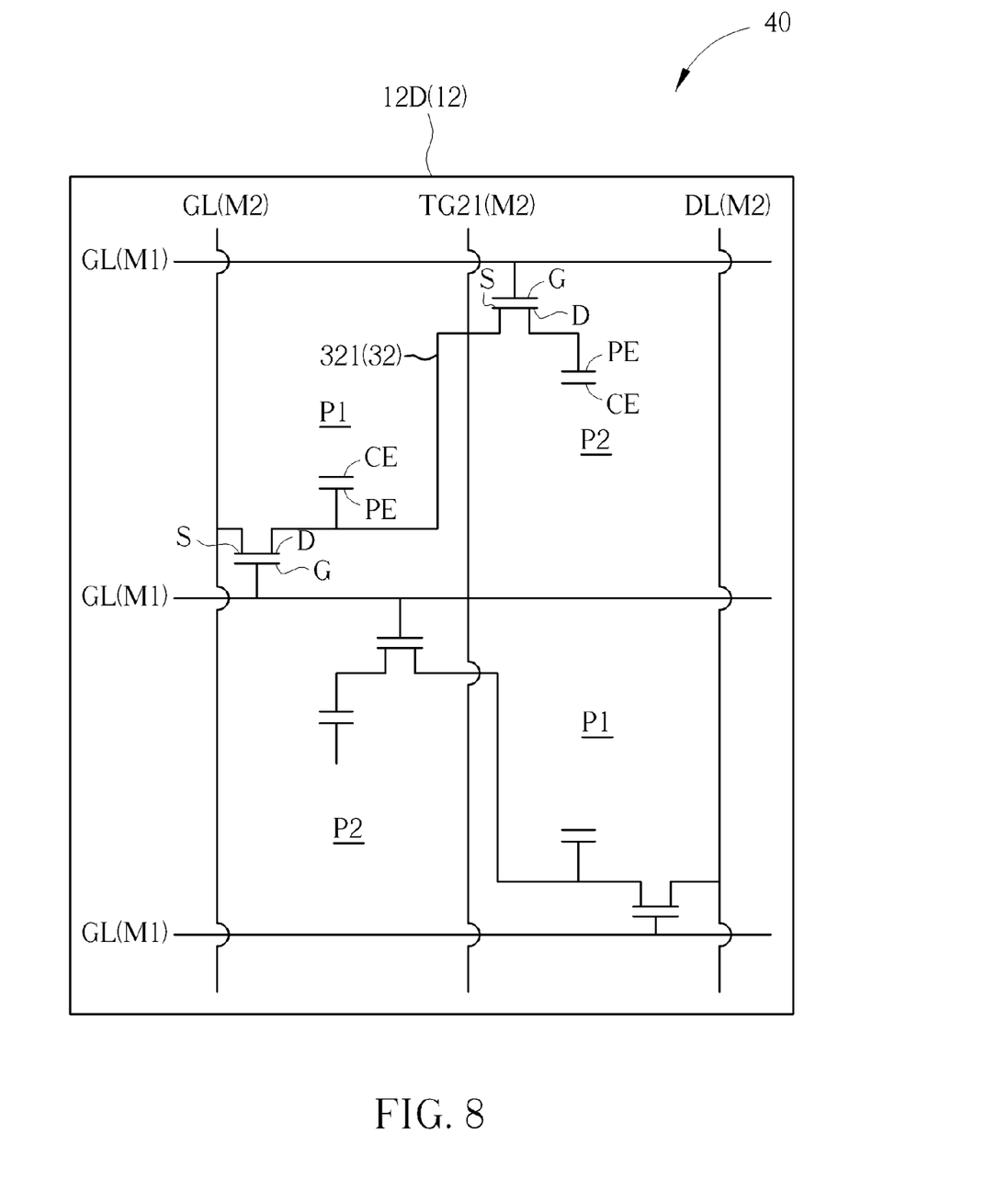
FIG. 8 is a schematic diagram illustrating a pixel of the array substrate structure of the display panel according to the another preferred embodiment.

Please refer to FIG. 7 and FIG. 8. In order to clearly describe the structure of the present invention, FIG. 1 should also be referred together. FIG. 7 is a schematic diagram illustrating an array substrate structure of a display panel according to another preferred embodiment of the present invention and FIG. 8 is a schematic diagram illustrating a pixel of the array substrate structure of the display panel according to the preferred embodiment. As shown in FIG. 7, different from the abovementioned embodiment, the first patterned transparent conductive layer 32 of the array substrate structure 40 of the display panel of the preferred embodiment includes a plurality of pixel electrodes PE disposed in the display region 12D. Each of the pixel electrodes PE is electrically connected to the corresponding drain electrode D. In addition, the second patterned transparent conductive layer 36 includes a plurality of common electrodes CE disposed in the display region 12D, and each of the common electrodes CE includes a plurality of slits SL. Furthermore, according to the preferred embodiment, a first sub-pixel P1 and a second sub-pixel P2 are disposed in the display region 12D as shown in FIG. 8. The first patterned transparent conductive layer 32 further includes a transparent bridge electrode 321. The source electrode S of the first sub-pixel P1 is electrically connected to the corresponding data line DL, the pixel electrode PE of the first sub-pixel P1 is electrically connected to the drain electrode D of the first sub-pixel P1 and to the source electrode S of the second sub-pixel P2 through the transparent bridge electrode 321. And the pixel electrode PE of the second sub-pixel P2 is electrically connected to the drain electrode D of the second sub-pixel P2.

Figure 9:
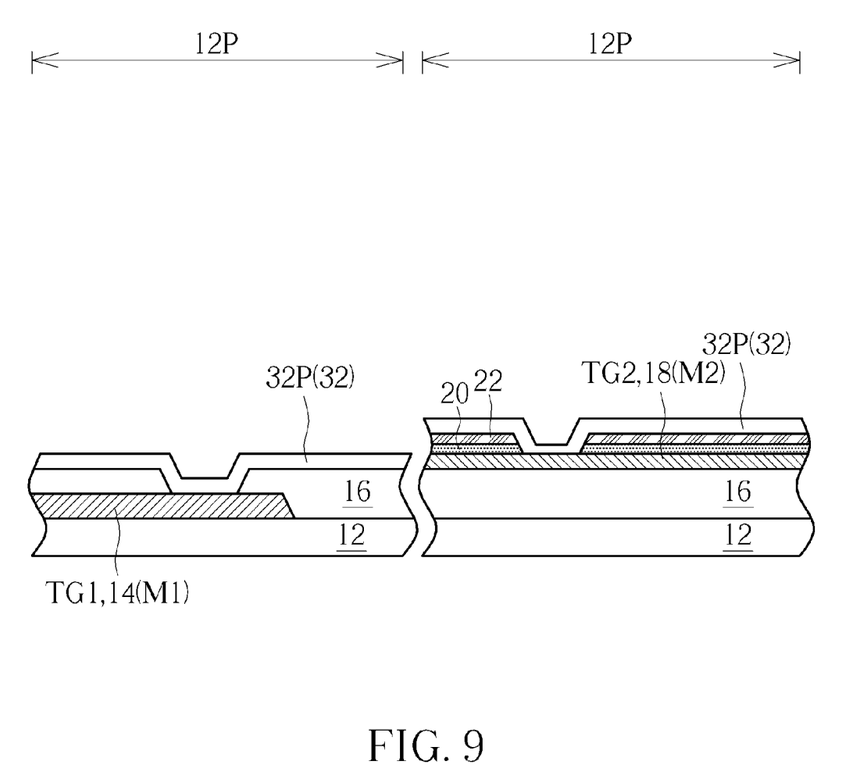
FIG. 9 is a schematic diagram illustrating a pad of the array substrate structure of the display panel according to a first variant embodiment to the present invention.

Please refer to FIG. 9, which is a schematic diagram illustrating a pad of the array substrate structure of the display panel according to a first variant embodiment to the present invention. According to the first variant embodiment, the first patterned transparent conductive layer 32 further includes a plurality of pads 32P disposed in the pad region 12P and electrically connected to each of the first gate tracking lines TG1 (the first wirings 14) and each of the second gate tracking lines TG2 (the second wirings 18), respectively, as shown in FIG. 9. It is found that different the preferred embodiment shown in FIG. 5, the first gate tracking lines TG1 (the first wirings 14) is not connected to the connecting electrodes, and the pads 32P are formed by the first patterned transparent conductive layer 32, instead of the second patterned transparent conductive layer according to the first variant embodiment. Furthermore, the first protective patterns 20 and the second protective patterns 22 can extend to the pad region 12P from the wiring region 12W and expose a portion of the second gate tracking lines TG2 (the second wirings 18), and the pads 32P are electrically connected to the second gate tracking lines TG2 (the second wirings 18) through the openings in the first protective patterns 20 and the second protective patterns 22. According to the variant embodiment, the second gate tracking lines TG2 (the second wirings 18) are covered and protected by the first protective patterns 20 and the second protective patterns 22 except where the pads 32P are formed. Therefore the second gate tracking lines TG2 (the second wirings 18) are protected from being damaged during etching the first protective layer (not shown).

Figure 10:
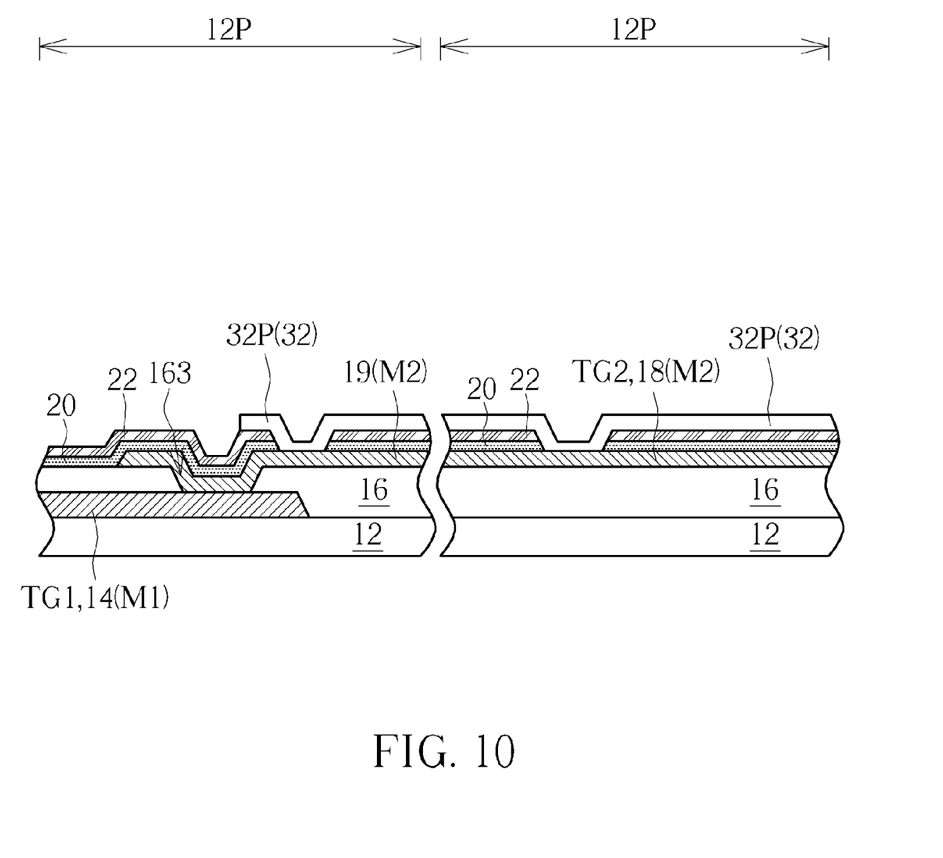
FIG. 10 is a schematic diagram illustrating a pad of the array substrate structure of the display panel according to a second variant embodiment to the present invention.

Please refer to FIG. 10, which is a schematic diagram illustrating a pad of the array substrate structure of the display panel according to a second variant embodiment to the present invention. According to the second variant embodiment, the first patterned insulating layer 16 has the third contact holes 163 exposing a portion the first gate tracking lines TG1 (the first wirings 14), and the second patterned conductive layer M2 includes the connecting electrodes 19 electrically connected to the exposed the first gate tracking line TG1 (the first wiring 14) as shown in FIG. 10. Additionally, the first patterned transparent conductive layer 32 further includes a plurality of pads 32P disposed in the pad region 12P and electrically connected to the connecting electrodes 19 and the second gate tracking lines TG2 (the second wirings 18), respectively. Accordingly, similar with the first variant embodiment shown in FIG. 9, the pads 32P of the second variant embodiment are formed by first patterned transparent conductive layer 32, and the first protective patterns 20 and the second protective patterns 22 extend to the pad region 12P from the wiring region 12W and expose a portion of the second gate tracking lines TG2 (the second wirings 18). The pads 32P are electrically connected to the second gate tracking lines TG2 (the second wirings 18) through the opening in the first protective patterns 20 and the second protective patterns 22. Different from the first variant embodiment shown in FIG. 9, the first gate tracking lines TG1 (the first wirings 14) are connected to the connecting electrodes 19 while the pads 32P are electrically connected to the first gate tracking lines TG1 (the first wirings 14) through the connecting electrodes 19 according to the second variant embodiment. Also in the second variant embodiment, the second gate tracking lines TG2 (the second wirings 18) are covered and protected by the first protective patterns 20 and the second protective patterns 22 except where the pads 32P are formed. Therefore the second gate tracking lines TG2 (the second wirings 18) are protected from being damaged during etching the first protective layer (not shown).

Accordingly, the wirings in the wiring region of the array substrate structure of the display panel of the present invention are sequentially covered by the semiconductor protective patterns and the inorganic insulating patterns. Therefore the wirings are always protected from being damaged during etching other layers formed on the wirings. And thus yield and reliability are both improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming an array substrate structure of a display panel, comprising:
  providing a substrate having a display region and a wiring region;
  forming a first patterned conductive layer on the substrate, the first patterned conductive layer comprising:
    a plurality of gate lines disposed in the display region;
    a plurality of gate electrodes disposed in the display region; and
    a plurality of first gate tracking lines disposed in the wiring region, the first gate tracking lines being electrically connected to a portion of the gate lines;
  forming a first patterned insulating layer on the first patterned conductive layer, the first patterned insulating layer having a plurality of first contact holes respectively exposing a portion of the gate lines;
  forming a second patterned conductive layer on the first patterned insulating layer, the second patterned conductive layer comprising:
    a plurality of data lines disposed in the display region;
    a plurality of source electrodes and a plurality drain electrodes disposed in the display region; and
    a plurality of second gate tracking lines electrically connected to the exposed portions of the gate lines through the first contact holes;
  forming a patterned semiconductor layer and a second patterned insulating layer on the second patterned conductive layer, the patterned semiconductor layer comprising a plurality of semiconductor channel layers and a plurality of first protective patterns, the semiconductor channel layers being disposed in the display region and disposed on the corresponding gate electrodes, at least a portion of the first protective patterns being disposed in the wiring region and disposed on the corresponding second gate tracking lines, the second patterned insulating layer comprising a plurality of channel protective layers and a plurality of second protective patterns, the channel protective layers being disposed in the display region and disposed on the corresponding semiconductor channel layers, at least a portion of the second protective patterns being disposed in the wiring region and disposed respectively on the corresponding first protective patterns;
  forming a first patterned protective layer and a second patterned protective layer on the second patterned conductive layer, the first patterned protective layer and the second patterned protective layer exposing each of the second protective patterns, and the first patterned protective layer and the second patterned protective layer having a plurality of second contact holes respectively exposing the drain electrodes; and
  forming a first patterned transparent conductive layer on the second patterned protective layer.

2. The method for forming the array substrate structure of the display panel of claim 1, wherein the substrate further comprises a pad region defined thereon, and the first patterned transparent conductive layer further comprises a plurality of pads disposed in the pad region and electrically connected to each of the first gate tracking lines and each of the second gate tracking lines, respectively.

3. The method for forming the array substrate structure of the display panel of claim 1, wherein the substrate further comprising a pad region, the first patterned insulating layer has a plurality of third contact holes respectively exposing a portion of each first gate tracking line, the second patterned conductive layer further comprises a plurality of connecting electrodes electrically connected to the exposed first gate tracking lines respectively, and the first patterned transparent conductive layer further comprises a plurality of pads disposed in the pad region and electrically connected to each of the connecting electrodes and each of the second gate tracking lines, respectively.

4. The method for forming the array substrate structure of the display panel of claim 1, further comprising:
    forming a third patterned protective layer on the first patterned transparent conductive layer; and
    forming a second patterned transparent conductive layer on the third patterned protective layer.

5. The method for forming the array substrate structure of the display panel of claim 4, wherein the substrate further comprises a pad region defined thereon, the first patterned insulating layer has a plurality of third contact holes respectively exposing a portion of each first gate tracking line, the second patterned conductive layer further comprises a plurality of connecting electrodes electrically connected to the exposed first gate tracking lines respectively, the third patterned protective layer has a plurality of fourth contact holes respectively exposing each of the connecting electrodes and each of the second gate tracking lines, and the second patterned transparent conductive layer further comprises a plurality of pads disposed in the pad region and electrically connected to each of the connecting electrodes and each of the second gate tracking lines through each of the fourth contact holes, respectively.

6. The method for forming the array substrate structure of the display panel of claim 4, wherein the first patterned transparent conductive layer comprises a plurality of common electrodes disposed in the display region, the second patterned transparent conductive layer comprises a plurality of pixel electrodes disposed in the display region, each of the pixel electrodes is electrically connected to the corresponding drain electrode, and each of the pixel electrodes further has a plurality of slits.

7. The method for forming the array substrate structure of the display panel of claim 6, wherein a first sub-pixel and a second sub-pixel are formed in the display region, the second patterned transparent conductive layer further comprises a transparent bridge electrode, the source electrode of the first sub-pixel is electrically connected to the corresponding data line, the pixel electrode of the first sub-pixel is electrically connected to the drain electrode of the first sub-pixel and to the source electrode of the second sub-pixel through the transparent bridge electrode, and the pixel electrode of the second sub-pixel is electrically connected to the drain electrode of the second sub-pixel.

8. The method for forming the array substrate structure of the display panel of claim 4, wherein the first patterned transparent conductive layer comprises a plurality of pixel electrodes disposed in the display region, each of the pixel electrodes is electrically connected to the corresponding drain electrode, and the second patterned transparent conductive layer comprises a plurality of common electrodes disposed in the display region, and each of the common electrodes has a plurality of slits.

9. The method for forming the array substrate structure of the display panel of claim 8, wherein a first sub-pixel and a second sub-pixel are formed in the display region, the first patterned transparent conductive layer further comprises a transparent bridge electrode, the drain electrode of the first sub-pixel is electrically connected to the corresponding data line, the pixel electrode of the first sub-pixel is electrically connected to the drain electrode of the first sub-pixel and to the source electrode of the second sub-pixel through the transparent bridge electrode, and the pixel electrode of the second sub-pixel is electrically connected to the drain electrode of the second sub-pixel.

10. The method for forming the array substrate structure of the display panel of claim 1, wherein the second gate tracking lines comprises a plurality of second internal gate tracking lines disposed in the display region and extending to the wiring region, and a plurality of second external gate tracking lines disposed in the wiring region.

11. The method for forming the array substrate structure of the display panel of claim 1, wherein forming the first patterned protective layer and the second patterned protective layer on the second patterned conductive layer comprises:
    forming a first protective layer and a second protective layer on the second patterned conductive layer;
    performing a photolithography process on the second protective layer to remove portions of the second protective layer and to form the second patterned protective layer; and
    etching the first protective layer exposed by the second patterned protective layer, which serves as an etching mask, to form the first patterned protective layer.

12. The method for forming the array substrate structure of the display panel of claim 1, wherein the second patterned conductive layer comprises a plurality of data connecting lines disposed in the wiring region and electrically connected to the corresponding data lines, and a portion of the first protective patterns and a portion of the second protective patterns are disposed on the data connecting lines.

13. An array substrate structure of a display panel comprising:
    a substrate having a wiring region and a display region defined thereon;
    a first patterned conductive layer disposed on the substrate and comprising a plurality of gate lines and gate electrodes disposed in the display region and a plurality of first gate tracking lines electrically connected to a portion of the gate lines;
    a plurality of first wirings disposed in the wiring region;
    a first patterned insulating layer disposed on the first wirings, wherein the first patterned insulating layer further has a plurality of first contact holes respectively exposing a portion of the gate lines;
    a plurality of second wirings disposed on the first patterned insulating layer;
    a second patterned conductive layer disposed on the first patterned insulating layer and comprising a plurality of data lines, a plurality of source electrodes and a plurality of drain electrodes disposed in the display region and a plurality of second gate tracking lines electrically connected to the exposed portions of the gate lines through the first contact holes;
    a patterned semiconductor layer disposed on the second patterned conductive layer and comprising a plurality first protective patterns disposed in the wiring region and respectively disposed on corresponding second wirings, and a plurality of semiconductor channel layers disposed in the display region and respectively disposed on the corresponding gate electrodes, each of the first protective patterns comprising a semiconductor material;

a second patterned insulating layer disposed on the patterned semiconductor layer and comprising a plurality of second protective patterns disposed in the wiring region and respectively disposed on the corresponding first protective patterns, and a plurality of channel protective layers disposed in the display region and disposed on the corresponding semiconductor channel layers, each of the second protective patterns comprising an inorganic insulating material;

a first patterned protective layer disposed on the second patterned insulating layer;

a second patterned protective layer disposed on the first patterned protective layer, wherein the first patterned protective layer and the second patterned protective layer expose each of the second protective patterns, and the first patterned protective layer and the second patterned protective layer have a plurality of second contact holes respectively exposing the drain electrodes;

a first patterned transparent conductive layer disposed on the second patterned protective layer;

a third patterned protective layer disposed on the first patterned transparent conductive layer; and a second patterned transparent conductive layer disposed on the third patterned protective layer;

wherein the first wirings comprise the first gate tracking lines, and the second wirings comprise the second gate tracking lines.

14. The array substrate structure of the display panel of claim 13, wherein the substrate further comprises a pad region and the first patterned transparent conductive layer further comprises a plurality of pads disposed in the pad region and electrically connected to each of the first gate tracking lines and each of the second gate tracking lines, respectively.

15. The array substrate structure of the display panel of claim 13, wherein the substrate further comprises a pad region, the first patterned insulating layer has a plurality of third contact holes respectively exposing a portion of each of the first gate tracking lines, the second patterned conductive layer further comprises a plurality of connecting electrodes electrically connected to the exposed first gate tracking lines respectively, and the first patterned transparent conductive layer further comprises a plurality of pads disposed in the pad region and electrically connected to each of the connecting electrodes and each of the second gate tracking lines, respectively.

16. The array substrate structure of the display panel of claim 13, wherein the substrate further comprises a pad region, the first patterned insulating layer has a plurality of third contact holes respectively exposing a portion of each of the first gate tracking lines, the second patterned conductive layer further comprises a plurality of connecting electrodes electrically connected to the exposed first gate tracking lines respectively, the third patterned protective layer has a plurality of fourth contact holes respectively exposing a portion of each of the connecting electrodes and each of the second gate tracking lines, the second patterned transparent conductive layer further comprises a plurality of pads disposed in the pad region and electrically connected to each of the connecting electrodes and each of the second gate tracking lines through each of the fourth contact holes, respectively.

17. The array substrate structure of the display panel of claim 13, wherein the second gate tracking lines comprises a plurality of second internal gate tracking lines disposed in the display region and extending to the wiring region, and a plurality of second external gate tracking lines disposed in the wiring region.

18. The array substrate structure of the display panel of claim 17, wherein the first gate tracking lines and the second external gate tracking lines are alternately arranged.

19. The array substrate structure of the display panel of claim 13, wherein the first patterned transparent conductive layer comprises a plurality of common electrodes disposed in the display region, the second patterned transparent conductive layer comprises a plurality of pixel electrodes disposed in the display region, each of the pixel electrodes is electrically connected to the corresponding drain electrode and each of the pixel electrodes has a plurality of slits.

20. The array substrate structure of the display panel of claim 19, further comprising a first sub-pixel and a second sub-pixel disposed in the display region, wherein the second patterned transparent conductive layer further comprises a transparent bridge electrode, the source electrode of the first sub-pixel is electrically connected to the corresponding data line, the pixel electrode of the first sub-pixel is electrically connected to the drain electrode of the first sub-pixel and to the source electrode of the second sub-pixel through the transparent bridge electrode, and the pixel electrode of the second sub-pixel is electrically connected to the drain electrode of the second sub-pixel.

21. The array substrate structure of the display panel of claim 13, wherein the first patterned transparent conductive layer comprises a plurality of pixel electrodes disposed in the display region, each of the pixel electrodes is electrically connected to the corresponding drain electrodes, and the second patterned transparent conductive layer comprises a plurality of common electrodes disposed in the display region, and each of the common electrodes comprises a plurality of slits.

22. The array substrate structure of the display panel of claim 21, further comprising a first sub-pixel and a second sub-pixel disposed in the display region, wherein the first patterned transparent conductive layer further comprises a transparent bridge electrode, the source electrode of the first sub-pixel is electrically connected to the corresponding data line, the pixel electrode of the first sub-pixel is electrically connected to the drain electrode of the first sub-pixel and to the source electrode of the second sub-pixel through the transparent bridge electrode, and the pixel electrode of the second sub-pixel is electrically connected to the drain electrode of the second sub-pixel.

23. The array substrate structure of the display panel of claim 13, wherein the second wirings further comprises a plurality of data connecting lines disposed in the wiring region and electrically connected to the data lines, respectively.

* * * * *